(12) United States Patent
Van Lunteren

(10) Patent No.: US 8,427,201 B2  
(45) Date of Patent: Apr. 23, 2013

(54) LOCAL RESULT PROCESSOR

(75) Inventor: Jan Van Lunteren, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 13/070,864

(22) Filed: Mar. 24, 2011

(65) Prior Publication Data

US 2012/0242369 A1 Sep. 27, 2012

(51) Int. Cl.
H03K 19/173 (2006.01)

(52) U.S. Cl.
USPC ............................ 326/38; 326/8; 714/1

(58) Field of Classification Search .............. 326/8, 9, 326/38, 46; 714/1, 735–738
See application file for complete search history.

(56) References Cited

U.S. PATENT DOCUMENTS

| | | | |
|---|---|---|---|
| 8,046,834 B2* | 10/2011 | Flynn et al. | 726/24 |
| 2005/0021994 A1* | 1/2005 | Barton et al. | 713/200 |
| 2005/0027686 A1* | 2/2005 | Shipp | 707/3 |
| 2008/0071783 A1* | 3/2008 | Langmead et al. | 707/6 |
| 2008/0189530 A1* | 8/2008 | McIntosh et al. | 712/227 |
| 2010/0205411 A1 | 8/2010 | Lunteren | |

* cited by examiner

*Primary Examiner* — Don Le  
(74) *Attorney, Agent, or Firm* — Cantor Colburn LLP; Daniel Morris

(57) ABSTRACT

A system includes a register, a first logical function portion, the first logical function portion operative to receive a first numerical value from the register, perform a first logical function with the first numerical value, and output a second numerical value, a second logical function portion, the second logical function portion operative to receive the first numerical value from the register, perform a second logical function with the first numerical value, and output a third numerical value, and a control logic portion, the control logic portion operative to receive the first numerical value from the register, determine whether the first numerical value includes a code associated with either the first logical function or the second logical function, and responsive to determining that the code is associated with the first logical function, and direct the output of the second numerical value to an input of the register.

20 Claims, 5 Drawing Sheets

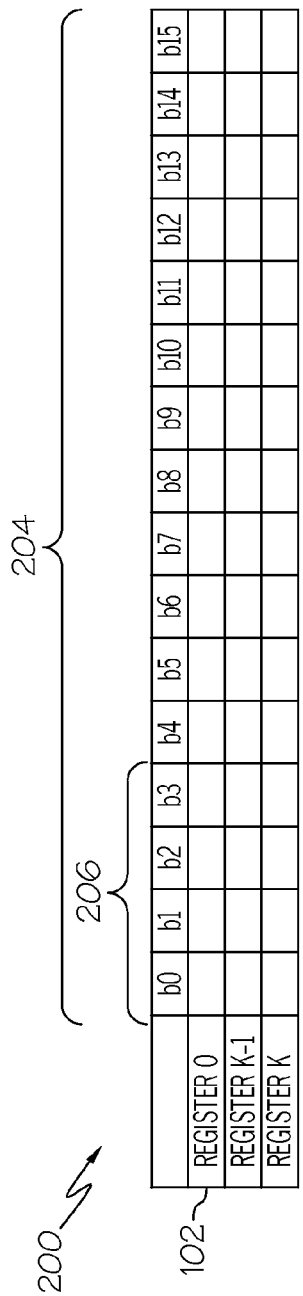

LOCAL RESULT PROCESSOR

BACKGROUND

The present invention relates to processors, and more specifically, to registers in processors.

A processor register (register) is a storage device that may be used to store numeric values in an array. The numeric values are stored as bits in the register. Registers are usually classified by the size of the register such that an 8-bit register may store up to eight bits and a 32-bit register may store up to 32 bits. Many processing tasks include storing data in registers and manipulating the data in the registers. Typically, data is stored in a register by a processor that writes and reads bits into or from the register. Two common processing tasks that are often performed using registers include counting and shifting bits.

Count registers and shift registers may be used for a variety of processing tasks. For example, pattern recognition tasks that are frequently used for virus and malware detection in computing systems often use count registers and shift registers.

BRIEF SUMMARY

According to one embodiment of the present invention, system includes a register, a first logical function portion communicatively connected to the register, the first logical function portion operative to receive a first numerical value from the register, perform a first logical function with the first numerical value, and output a second numerical value, a second logical function portion communicatively connected to the register, the second logical function portion operative to receive the first numerical value from the register, perform a second logical function with the first numerical value, and output a third numerical value, and a control logic portion communicatively connected to the register, the control logic portion operative to receive the first numerical value from the register, determine whether the first numerical value includes a code associated with either the first logical function or the second logical function, and responsive to determining that the code is associated with the first logical function, and direct the output of the second numerical value to an input of the register.

According to another embodiment of the present invention, method includes receiving a first numerical value from a register, performing a logical function with the first numerical value to generate a second numerical value, determining whether the first numerical value includes a code associated with the logical function, and sending the second numerical value to the register responsive to determining that the first numerical value includes the code associated with the logical function.

According to yet another embodiment of the present invention, a system includes a first register, a processor communicatively connected to the first register, a plurality of logical function portions each of the logical function portions communicatively connected to an output of the register and an input of a multiplexer portion, and operative to perform a logical function with at a numerical value received from the first register, a control logic portion communicatively connected to the register and a control input of the multiplexer portion, the control logic operative to receive the numerical value from the first register, decode a tag in the numerical value, identify a logical function of the plurality of logical functions that is associated with the decoded tag, control the multiplexer such that the multiplexer outputs a numerical value output from the identified logical function of the plurality of logical functions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates an exemplary embodiment of the registers that are arranged in an array.

FIG. 3 illustrates an exemplary table that includes examples of tag codes and corresponding self-running instructions.

DETAILED DESCRIPTION

Processors often use processor registers to store numerical data while performing processing tasks. Data is typically stored in a register by a processor that writes data to the register using a write instruction. The processor may retrieve data from a register by reading from the register using a read instruction. When a processor reads or writes data to a register, reading and writing instructions processed by the processor consume processing resources. Some registers may be used for counting or shifting processes. For example, a register used for counting increments a numerical value periodically when the register receives an increment instruction from the processor. Registers used for shifting, shift bits in the register when the shift register receives a shift instruction. A shift register typically receives bit(s) from the processor as inputs and output bit(s) to the processor in a shift process. For example, in a shift process in a one-dimensional 8-bit array (having positions 0-7) when the processor sends a shift instruction, the register "shifts in" a bit at position 0, the bit that was previously at the position 0 shifts to the position 1, the bit that was previously at the position 1 shift to the position 2, and so on. The bit that was previously at position 7 is "shifted out" of the register and received by the processor.

Shift registers and count registers are often used in processing tasks such as, for example, pattern recognition tasks that are frequently used for virus and malware detection. In such tasks, processing resources are used for each shift or count instruction sent to the registers. When numerous registers are used for a task, each shift or count instruction consumes processing resources that may be used for other tasks. The exemplary embodiments described below include methods and systems that allow a register to perform shifting, counting, or other tasks without receiving instructions from the processor for each shift or count cycle.

Figure 1:
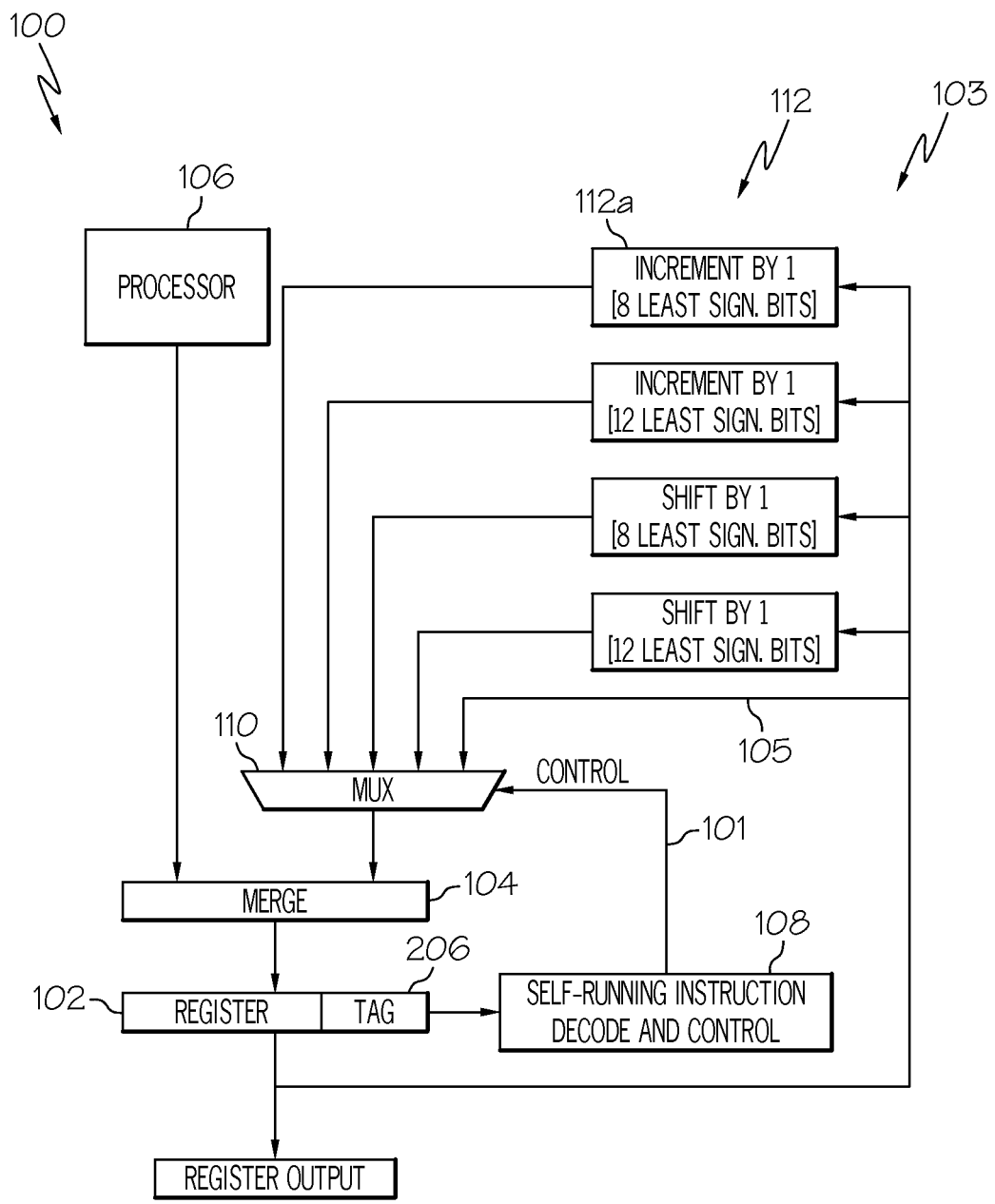
FIG. 1 illustrates a block diagram of a system that includes local result processing portion and a processor.

FIG. 1 illustrates a block diagram of a system 100 that includes local result processing portion 103 and a processor 106. The local result processing portion 103 includes a register 102 a logical merging arrangement portion 104, a self-running instruction decode and control logic portion (control logic portion) 108, and a multiplexer portion 110 that is controlled via a control line 101 by the control logic portion 108. Local result processing may include for example, post-processing functions that may be used by, for example, hardware-based pattern matching engines. FIG. 2 illustrates an exemplary embodiment of the registers 102 that are arranged in an array 200. The register array 200 of the illustrated embodiment includes (0-k) registers each including 16 (b0-b15) positions or bits 204. Though the illustrated embodiment includes an array 200 having 16-bit registers alternate embodiments may include any number of registers 102 having any number of bits. In the illustrated embodiment bits b0-b3 are tag code (tag) bits that are used to indicate a self-running instruction for the register 102. In this regard, the tag bit b0 is an enablement bit such that the bit b0 being set to 1 indicates that a self-running instruction is present in the register. Conversely, the bit b0 being set to 0 indicates that no self-running instruction is present in the register. The tag bits b1-b3 are used to indicate a type of self-running instruction that will be performed on the register.

Referring to FIG. 1, in operation, the processor 106 outputs an instruction to the register 102 via the merging arrangement portion 104. The instruction may include for example, an updated register value and tag bits 206. In each clock cycle (or, in some embodiments multiples of clock cycles) the control logic portion 108 reads the register 102 and decodes the tag bits 206. In decoding, the control logic portion 108 determines whether the enablement bit (e.g., b0 of FIG. 2) is set to either 0 or 1 (i.e., 0=>disabled; 1=>enabled). If the enablement bit is disabled, the control logic portion 108 does not send instructions to the register 102, and the register may function by receiving instructions from the processor 106. If the enablement bit is enabled, the control logic portion 108 decodes the remaining tag bits (e.g., b1-b3) to identify a self-running instruction that corresponds to the tag bits. FIG. 3 illustrates an exemplary table 300 that includes examples of tags 206 and corresponding self-running instructions 302 that may be decoded and controlled by the control logic portion 108. The exemplary table 300 is merely one exemplary embodiment; a similar table may include any number of alternative self-running instructions 302 having any appropriate associated tags 206.

The contents of the register 102 are output to a plurality of logical function portions 112 (logical function portions). Each of the logical function portions 112 include, for example, logical gates that are arranged to perform a self-running instruction 302 listed in the table 300 (of FIG. 3) on the received output bits from the register 102. The logical function portions 112 output the processed register bits to inputs of the multiplexer portion 110. When the control logic portion 108 decodes a tag 206 from the register 102 that identifies one of the self-running instructions 302 for performance on the contents of the register 102, the control logic portion 108 identifies the logical function portion 112 that corresponds with the self-running instruction 302. The control logic portion 108 controls the multiplexer portion 110 such that the multiplexer portion 110 outputs the processed register bits from the identified logical function portion 112, which are written to the register 102. The system 100 includes a feedback path 105 that routes the numerical value from the register 102 to the multiplexer portion 110 without passing through a logical function portion 112. In operation, if the control logic portion 108 decodes a tag 206 that includes, for example an enablement bit set to disable (e.g., 0), the control logic portion 108 switches the multiplexer to output the numerical value received by the multiplexer 110 from the feedback path 105, thus bypassing the logical function portions 112. For example, the tag with an enablement bit set to disable is associated with the feedback path (i.e., a "null" logical function portion 112).

In one exemplary operation, the processor 106 writes the value (<1101 0000 0000 0000>) to the register 102. The value in the register 102 is output to the logical function portions 112, which perform self-running instructions 302 (of FIG. 3). The control logic portion 108 receives the value from the register 102 and decodes the tag portion of the value (i.e., (1101)). The tag portion 206 of the value corresponds to the self-running instruction 302 (8b counter: b8-b15 (increment)). The control logic portion 108 identifies the logical function portion 112a that corresponds to the decoded self-running instruction 302, and controls the output of the multiplexer portion 110 such that the output from the logical function portion 112a (<1101 0000 0000 0001>) is written to the register 102. The newly written value (<1101 0000 0000 0001>) is subsequently output to the logical function portions 112, which perform their logical functions, and the control logic portion 108 that decodes the tag 206 and controls the multiplexer portion 110 accordingly. Thus, if the tag continues to include the value 1101, the register will increment in each processing cycle without additional instructions (i.e., increment instructions) from the processor 106. The processor 106 may receive the contents of the register 102 by, for example sending a read instruction to the register 102. The processor 106 may stop the incrementing process by, for example, writing a different value to the register 102 that includes a different tag such as, for example, a tag with the enablement bit set to 0, or another tag and register value.

Figure 4:
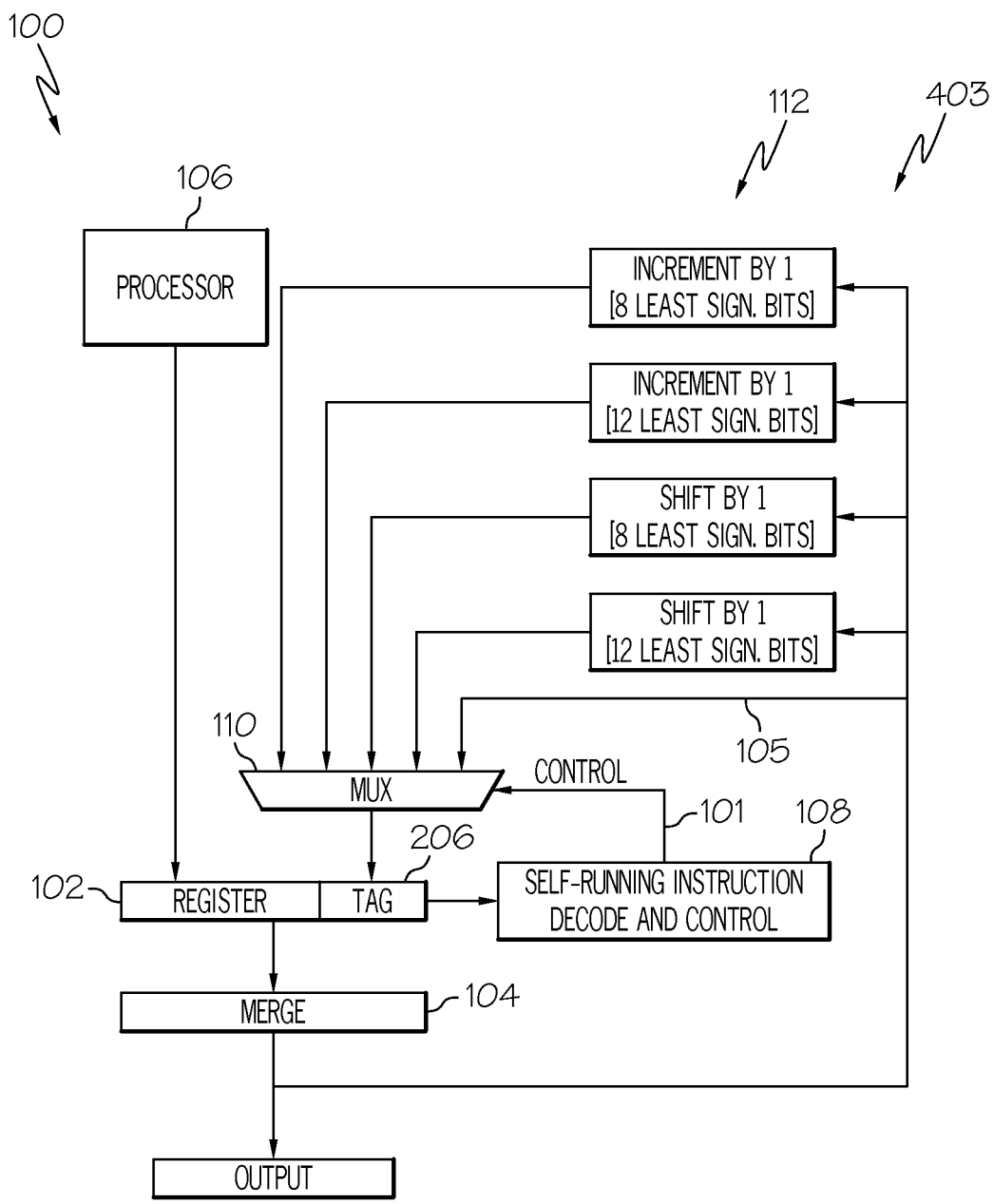
FIG. 4 illustrates an alternate embodiment of a system.

FIG. 4 includes an alternate embodiment of a system 400. The system 400 includes a processor 106 and a local result processing portion 403. The local result processing portion 403 includes a register 102 a logical merging arrangement portion 104, a self-running instruction decode and control logic portion (control logic portion) 108, and a multiplexer portion 110 that is controlled via a control line 101 by the control logic portion 108. The system 400 operates in a similar manner as the system 100 (of FIG. 1) described above however, the output of the register 102 is merged by the merge portion 104 with instructions from the processor 106 prior to being output to the logical function portions 112. The merge portion 104 includes logic that may include for example, a bit-wise OR operation. The merge portion 104 may also include logic that may be used to deconflict or prioritize modifications directed towards the same bit positions in the register 102. For example, the merge portion 104 may set operations that are received from the processor 106 as having a higher priority than operations received from the multiplexer portion 110.

Figure 5:
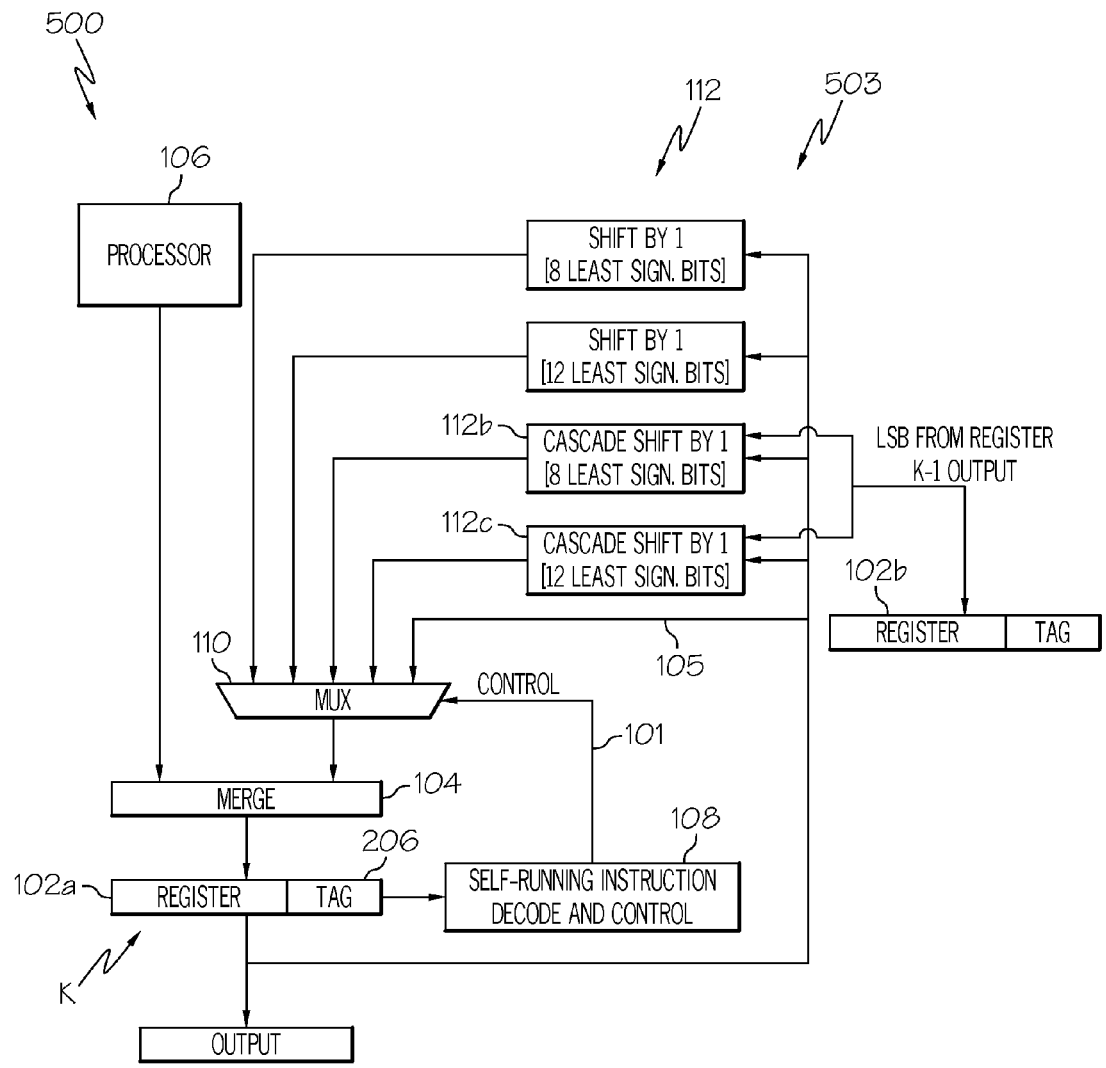
FIG. 5 illustrates another alternate embodiment of a system.

FIG. 5 includes an alternate embodiment of a system 500. The system 500 includes a processor 106 and a local result processing portion 503. The local result processing portion 503 includes a register 102a a logical merging arrangement portion 104, a self-running instruction decode and control logic portion (control logic portion) 108, and a multiplexer portion 110 that is controlled via a control line 101 by the control logic portion 108. The system 500 operates in a similar manner as the system 100 (of FIG. 1) described above however, the logical function portions 112b and 112c are arranged to receive the least significant bit (LSB) from a second register 102*b*. The logical function portions 112*b* and 112*c* include logic to perform a cascading shift function using the LSB from the second register 102*b*. Such a cascading arrangement allows any number of registers 102 to be used to implement a cascading shift function (e.g., a local result processing portion (not shown) associated with the second register 102*b* may receive a LSB from a third register 102*c* (not shown) and perform a similar cascading shift function). Though the illustrated embodiment includes a cascading shift function that receives the LSB from an adjacent register 102, other functions may be implemented such as counting functions that similarly receive bits from adjacent registers 102.

Figure 6:
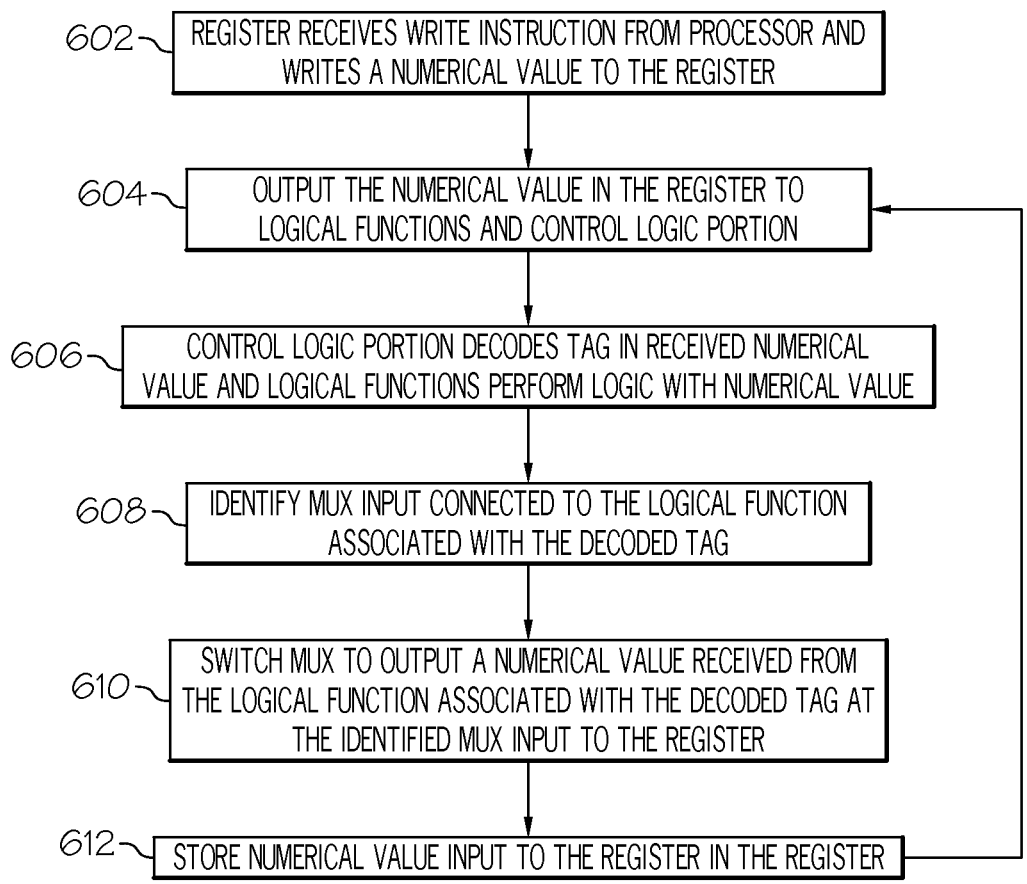
FIG. 6 illustrates a flow diagram of an exemplary method that may be performed by the system embodiments of FIGS. 1, 4 and 5.

FIG. 6 is a flow diagram of an exemplary method that may be performed by the systems 100, 400, and 500 (of FIGS. 1, 4, and 5) described above. In this regard, in block 602, the register 102 receives a write instruction from the processor 106 and the numerical value in the write instruction is written or stored in the register 102. The numerical value stored in the register is output to logical function portions 112 that each perform a particular logical function with the numerical value from the register 102 in block 606. In some embodiments one or more of the logical function portions 112 may receive a second numerical value (e.g., a 16-bit number, or a least significant bit of a number) from a second register (e.g., register 102*b*, of FIG. 5) and perform a logical function on the received numerical value from the register 102 and the second numerical value from the register 102*b*. In block 606, the control logic portion 108 also decodes a tag from the received numerical value in the register 102. An input of the multiplexer (mux) portion 110, which is associated with the logical function of the decoded tag is identified in block 608. In block 610, the control logic portion 108 switches or controls the mux portion 110 to output the numerical value received from the logical function associated with the decoded tag at the mux 110 to the register 102. In block 612, the numerical value output from the mux 110 is stored in the register 102.

The technical effects and benefits of the illustrated embodiments include a local result processing portion that is operative to perform a variety of logical functions on numerical values in a register and write the results of the logical functions to the register after a single instruction is written to the register by a processor. Thus, processing resources are conserved by reducing a number of processing instructions that may be sent to the register to perform the logical functions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
a register;
a first logical function portion communicatively connected to the register, the first logical function portion operative to receive a first numerical value from the register, perform a first logical function with the first numerical value, and output a second numerical value;
a second logical function portion communicatively connected to the register, the second logical function portion operative to receive the first numerical value from the register, perform a second logical function with the first numerical value, and output a third numerical value; and
a control logic portion communicatively connected to the register, the control logic portion operative to receive the first numerical value from the register, determine whether the first numerical value includes a code associated with either the first logical function or the second logical function, and responsive to determining that the code is associated with the first logical function, and direct the output of the second numerical value to an input of the register.

2. The system of claim 1, wherein the control logic portion is further operative to direct the output of the third numerical value to an input of the register responsive to determining that the first numerical value includes a code associated with the second logical function.

3. The system of claim 2, wherein the system further comprises a multiplexer portion communicatively connected to an output of the first logical function portion, an output of the second logical function portion, and the input of the register, the multiplexer portion including a control input from the control logic portion.

4. The system of claim 3, wherein the system further comprises a processor. communicatively connected to the register.

5. The system of claim 4, wherein an output of the multiplexer and an output of the processor are communicatively connected to a merging portion operative to merge the output of the processor with the output of the multiplexer portion and output merged data to the input of the register.

6. The system of claim 3, wherein an output of the register and an output of the processor are communicatively connected to a merging portion operative to merge the output of the processor with the output of the register and output the merged data.

7. The system of claim 6, wherein the merged data is output to the first logical function portion and the second logical function portion.

8. The system of claim 1, wherein the system further comprises a second register, and the second logical function is operative to receive a fourth numerical value from the second register and perform the second logical function with both the first numerical value and the fourth numerical value.

9. The system of claim 8, wherein the fourth numerical value is the least significant bit of a value stored in the second register.

10. The system of claim 1, wherein the system further comprises a feedback path communicatively connected to an output of the register, wherein the control logic portion is further operative to direct an output of the feedback path to an input of the register responsive to determining that the code is associated with the feedback path.

11. A method comprising:
receiving a first numerical value from a register;
performing, using a processor, a logical function with the first numerical value to generate a second numerical value;
determining whether the first numerical value includes a code associated with the logical function; and
sending the second numerical value to the register responsive to determining that the first numerical value includes the code associated with the logical function.

12. The method of claim 8, further comprising performing a second logical function with the first numerical value to generate a third numerical value.

13. The method of claim 9, further comprising:
determining whether the first numerical value includes a code associated with the second logical function; and
sending the third numerical value to the register responsive to determining that the first numerical value includes the code associated with the second logical function.

14. The method of claim 8, further comprising:
receiving a fourth numerical value from a second register;
performing a third logical function with the first numerical value and the fourth numerical value;
determining whether the first numerical value includes a code associated with the third logical function; and
sending the fourth numerical value to the register responsive to determining that the first numerical value includes the code associated with the third logical function.

15. A system comprising:
a first register;
a processor communicatively connected to the first register;
a plurality of logical function portions each of the logical function portions communicatively connected to an output of the register and an input of a multiplexer portion, and operative to perform a logical function with a numerical value received from the first register;
a control logic portion communicatively connected to the register and a control input of the multiplexer portion, the control logic operative to receive the numerical value from the first register, decode a tag in the numerical value, identify a logical function of the plurality of logical functions that is associated with the decoded tag, control the multiplexer such that the multiplexer outputs a numerical value output from the identified logical function of the plurality of logical functions.

16. The system of claim 15, further comprising a merging portion arranged to receive the numerical value output from the identified logical function of the plurality of logical functions from the multiplexer and a numerical value output from the processor, merge the numerical value output from the identified logical function of the plurality of logical functions from the multiplexer and a numerical value output from the processor and output a resultant merged numerical value to the first register.

17. The system of claim 15, wherein the first register is arranged to receive the numerical value output from the identified logical function of the plurality of logical functions from the multiplexer.

18. The system of claim 17, further comprising a merging portion arranged to receive an output from the register and a numerical value output from the processor and output a resultant merged numerical value to the plurality of logical function portions.

19. The system of claim 15, further comprising a second register communicatively connected to at least one logical function of the plurality of logical functions.

20. The system of claim 19, wherein the at least one logical function of the plurality of logical function portions is operative to perform a logical function with at a numerical value received from both the first register and the second register.

* * * * *